(12) United States Patent
Kim et al.

(10) Patent No.: US 11,515,719 B2
(45) Date of Patent: Nov. 29, 2022

(54) DEVICE AND METHOD FOR DIAGNOSING SWITCH USING VOLTAGE DISTRIBUTION

(71) Applicant: LG Chem, Ltd., Seoul (KR)

(72) Inventors: Tae Youn Kim, Daejeon (KR); Ho Sang Jang, Daejeon (KR); Lyang Wook Jo, Daejeon (KR)

(73) Assignee: LG Energy Solution, Ltd.

( * ) Notice: Subject to any disclaimer, the term of this patent is extended or adjusted under 35 U.S.C. 154(b) by 894 days.

(21) Appl. No.: 16/305,719

(22) PCT Filed: Sep. 20, 2017

(86) PCT No.: PCT/KR2017/010304
§ 371 (c)(1),
(2) Date: Nov. 25, 2019

(87) PCT Pub. No.: WO2018/074744
PCT Pub. Date: Apr. 26, 2018

(65) Prior Publication Data
US 2020/0083732 A1    Mar. 12, 2020

(30) Foreign Application Priority Data

Oct. 19, 2016    (KR) .................. 10-2016-0135813

(51) Int. Cl.
*H02J 7/00*        (2006.01)
*G01R 1/20*        (2006.01)
(Continued)

(52) U.S. Cl.
CPC .............. *H02J 7/0068* (2013.01); *G01R 1/20* (2013.01); *G01R 19/165* (2013.01); *G01R 31/327* (2013.01); *G01R 15/04* (2013.01)

(58) Field of Classification Search
CPC ....................................................... H02J 7/00
See application file for complete search history.

(56) References Cited

U.S. PATENT DOCUMENTS 8,688,317 B2    4/2014    Boiron et al.
8,842,404 B2    9/2014    Vogel
(Continued)

FOREIGN PATENT DOCUMENTS

CN        101141076 A        3/2008
CN        101752618 A        6/2010
(Continued)

OTHER PUBLICATIONS

Chinese Search Report for Application No. 201780035163.5, dated Jun. 11, 2020, pp. 1-2.
(Continued)

*Primary Examiner* — Robert Grant
(74) *Attorney, Agent, or Firm* — Lerner, David, Littenberg, Krumholz & Mentlik, LLP (57) ABSTRACT

The present invention relates to a device and a method for diagnosing a switch using voltage distribution, and more particularly, to a device and a method for diagnosing a switch using voltage distribution, which connect one or more resistors connected in series with the switch in parallel and calculate voltage applied to one resistor among one or more resistors by using the voltage distribution to diagnose a state of the switch based on the calculated voltage, in order to diagnose the state of the switch positioned on a cathode power supply line connecting a battery and a load.

15 Claims, 5 Drawing Sheets

(51) Int. Cl.
   *G01R 19/165* (2006.01)
   *G01R 31/327* (2006.01)
   *G01R 15/04* (2006.01)

(56) References Cited

U.S. PATENT DOCUMENTS

| | | | |
|---|---|---|---|
| 9,733,292 | B2 | 8/2017 | Delbaere et al. |
| 2008/0061764 | A1 | 3/2008 | Tae et al. |
| 2010/0134068 | A1 | 6/2010 | Lim |
| 2014/0028322 | A1* | 1/2014 | Tzivanopoulos .. G01R 31/3277 324/433 |
| 2015/0162759 | A1 | 6/2015 | Fujii et al. |
| 2015/0346283 | A1 | 12/2015 | Kwon et al. |
| 2016/0154064 | A1 | 6/2016 | Klein et al. |

FOREIGN PATENT DOCUMENTS

| | | |
|---|---|---|
| CN | 103576046 A | 2/2014 |
| CN | 104541431 A | 4/2015 |
| DE | 102014117417 A1 | 6/2016 |
| EP | 2308714 A2 | 4/2011 |
| JP | 2006136161 A | 5/2006 |
| JP | 2008263763 A | 10/2008 |
| JP | 2010101766 A | 5/2010 |
| JP | 2014048050 A | 3/2014 |
| KR | 0378644 | 3/2005 |
| KR | 20130039817 A | 4/2013 |
| KR | 20130044187 A | 5/2013 |
| KR | 20130051228 A | 5/2013 |
| KR | 20130096481 A | 8/2013 |
| KR | 20140007180 A | 1/2014 |
| KR | 20140062534 A | 5/2014 |
| KR | 20160054935 A | 5/2016 |
| WO | 2011010026 A1 | 1/2011 |

OTHER PUBLICATIONS

Extended European Search Report including Written Opinion for Application No. EP17862940.8 dated Apr. 9, 2019.
International Search Report for PCT/KR2017/010304 dated Dec. 20, 2017.

\* cited by examiner

DEVICE AND METHOD FOR DIAGNOSING SWITCH USING VOLTAGE DISTRIBUTION

CROSS-REFERENCE TO RELATED PATENT APPLICATIONS

The present application is a national phase entry under 35 U.S.C. § 371 of International Application No. PCT/KR2017/010304 filed Sep. 20, 2017, published in Korean, which claims priority from Korean Patent Application No. 10-2016-0135813 filed Oct. 19, 2016, all of which are incorporated herein by reference.

TECHNICAL FIELD

The present invention relates to a device and a method for diagnosing a switch using voltage distribution, and more particularly, to a device and a method for diagnosing a switch using voltage distribution, which connect one or more resistors connected in series with the switch in parallel and calculate voltage applied to one resistor to be measured among one or more resistors by using the voltage distribution to diagnose a state of the switch based on the calculated voltage, in order to diagnose the state of the switch positioned on a cathode power supply line connecting a battery and a load.

BACKGROUND ART

A secondary battery which is high in application easiness according to a product group and has electrical characteristics including high energy density, and the like is universally applied to an electric vehicle (EV) driven by an electric driving source, a hybrid vehicle (HV) or an energy storage system (ESS) or an uninterruptible power supply (UPS) system using a medium/large battery used for a house or an industry as well as a portable device.

The secondary battery has received public attention as a new energy source for promoting eco-friendly performance and energy efficiency in that byproducts are not generated at all according to the use of the energy as well as a primary advantage of dramatically reducing the use of fossil fuels.

When the secondary battery is implemented as a battery of a portable terminal, or the like, it may not particularly be applied as above, but the battery applied to the electric vehicle or an energy storage source is used in a type in which a plurality of unit secondary battery cells is generally aggregated to increase suitability for a high-capacity environment.

When the unit secondary battery cells are aggregated as described above, unit cells may be inflated and broken due to overheating in the case where operation abnormality such as flow of overcurrent, or the like occurs. The overcurrent and overheating resulting from the abnormality of the battery may adversely affect the load connected to the battery, which may damage the load.

In the related art, in order to solve such a problem, at least one switching element is installed between the battery and the load, and the damage of the load is protected by on/off control of the switch when the abnormality occurs in the battery. For example, a contactor is installed between the battery and the load, and the voltage and current applied from the battery are supplied to the load through the contactor. However, when the switching element such as the contactor is additionally installed, it is necessary to check whether the voltage and the current applied from the battery are normally applied to the load by inspecting the state of the switching element. For example, when the contactor and a power supply line are not welded properly or when a welded portion is worn or damaged during use, power applied from the battery may not be normally applied to the load. There is a disadvantage in that volumes and prices of a battery pack and a battery management system increase when a separate system and an additional component for measuring and diagnosing the state of the switching element such as the contactor are provided to solve such a problem in the related art. Since such an increase in volume and price adversely affects high efficiency and high energy density of the secondary battery, there is a need to reduce the volume and the price of a switch diagnosing device.

DETAILED DESCRIPTION OF THE INVENTION

Technical Problem

An object of the present invention is to provide a device and a method for diagnosing a switch using voltage distribution, which connect a plurality of resistors connected in series with the switch in parallel and calculate voltage applied to one resistor among the plurality of resistors by using the voltage distribution to diagnose a state of the switch based on the calculated voltage, in order to diagnose the state of the switch positioned on a cathode power supply line connecting a battery and a load.

Further, another object of the present invention is to provide a device and a method for diagnosing a switch using voltage distribution, which receive voltage distributed by using one ADC converter and one control unit positioned outside and diagnose states of one or more of the plurality of switches based on the received voltage to reduce a volume and a price.

Technical Solution

A device for diagnosing a switch using voltage distribution according to an embodiment of the present invention may include: a cathode switch positioned on a cathode power supply line adapted to switch between connecting and disconnecting the battery and the load; a plurality of resistors connected with the cathode switch in parallel; and a control unit calculating voltage applied to one resistor to be measured of the plurality of resistors from the voltage of the battery applied to the plurality of resistors connected in series by using the voltage distribution and diagnosing a state of the cathode switch based on the calculated voltage.

The device may further include reference voltage generating unit generating reference voltage for diagnosing the state of the battery and the control unit may calculate the voltage to be applied to one resistor based on the reference voltage and compare the voltage applied to one resistor and the calculated voltage to diagnose the state of the cathode switch.

The device may further include an ADC conversion unit converting the voltage of the battery applied to one resistor into a digital signal and the control unit may diagnose the state of the cathode switch based on the digital signal.

The device may further include a switch unit positioned between the plurality of resistors and connecting or disconnecting the plurality of resistors and the control unit may apply the voltage of the battery to one of the plurality of resistors by controlling opening/closing of the switch unit and diagnose the state of the cathode switch based on the applied voltage.

The device may further include a correction voltage generating unit applying correction voltage to one or more resistors and the control unit may sum the voltage applied to one resistor and the correction voltage and diagnose the state of the cathode switch based on the summed voltage.

The device may further include: an anode switch positioned on an anode power supply line and adapted to switch between connecting and disconnecting the battery and the load; a diagnostic resistor diagnosing the anode switch; and a resistor unit of which a first side is connected with the anode switch and a second side is connected with the diagnostic resistor.

The control unit may calculate a voltage applied to the diagnostic resistor from a voltage of the battery applied to the resistor unit and the diagnostic resistor by using the voltage distribution and diagnose the state of the anode switch based on the calculated voltage.

The cathode switch and one or more resistors may be constituted by one cathode switch diagnosing unit and the control unit may be positioned outside the cathode switch diagnosing unit.

The anode switch, the resistor, and the diagnostic resistor may be constituted by one anode switch diagnosing unit and the control unit may be positioned outside the anode switch diagnosing unit.

A method for diagnosing a switch using voltage distribution according to an embodiment of the present invention may include: positioning a cathode switch on a cathode power supply line connecting a battery and a load and connecting or disconnecting the battery and the load; connecting one or more resistors with the cathode switch in parallel; and calculating, by a control unit, voltage applied to one resistor to be measured of one or more resistors from a voltage of the battery applied to one or more resistors connected in series by using the voltage distribution and diagnosing a state of the cathode switch based on the calculated voltage.

The method may further include generating, by a reference voltage generating unit, reference voltage for diagnosing the state of the battery and the diagnosing may include calculating the voltage to be applied to one resistor based on the reference voltage and comparing the voltage applied to one resistor and the calculated voltage to diagnose the state of the cathode switch.

The method may further include converting, by an ADC conversion unit, the voltage of the battery applied to one resistor into a digital signal and the diagnosing may further include diagnosing the state of the cathode switch based on the digital signal.

The method may further include positioning a switch unit between one or more resistors and connecting or disconnecting one or more resistors and the diagnosing may further include applying the voltage of the battery to one resistor by controlling opening/closing of the switch unit and diagnosing the state of the cathode switch based on the applied voltage.

The method may further include applying, by a correction voltage generating unit, correction voltage to one or more of the plurality of resistors and the diagnosing may further include summing the voltage applied to one resistor and the correction voltage and diagnosing the state of the cathode switch based on the summed voltage.

The method may further include: positioning an anode switch on an anode power supply line and adapted to switch between connecting and disconnecting the battery and the load; diagnosing, by a diagnostic resistor, the anode switch; and connecting a first side of a resistor unit with the anode switch and connecting a second side of the resistor unit with the diagnostic resistor.

The diagnosing may further include calculating a voltage applied to the diagnostic resistor from a voltage of the battery applied to the resistor unit and the diagnostic resistor by using the voltage distribution and diagnosing a state of the anode switch based on the calculated voltage.

The method may further include constituting the cathode switch and the plurality of resistors by one cathode switch diagnosing unit; and positioning the control unit outside the cathode switch diagnosing unit.

Advantageous Effects

According to an aspect of the present invention, it is possible to provide a device and a method for diagnosing a switch using voltage distribution, which connect a plurality of resistors connected in series with the switch in parallel and calculate voltage applied to one resistor to be measured among the plurality of resistors by using the voltage distribution to diagnose a state of the switch based on the calculated voltage.

Further, it is possible to provide a device and a method for diagnosing a switch using voltage distribution, which receive voltage distributed by using one ADC converter and one control unit positioned outside and diagnose states of one or more switches based on the received voltage to reduce a volume and a price.

BEST MODE

The present invention will be described below in detail with reference to the accompanying drawings. Herein, the repeated description and the detailed description of publicly-known function and configuration that may make the gist of the present invention unnecessarily ambiguous will be omitted. Embodiments of the present invention are provided for more completely describing the present invention to those skilled in the art. Accordingly, shapes, sizes, and the like of elements in the drawings may be exaggerated for clearer explanation.

Throughout the specification, unless explicitly described to the contrary, a case where any part "includes" any component will be understood to imply the inclusion of stated components but not the exclusion of any other component.

In addition, the term "unit" disclosed in the specification means a unit that processes at least one function or operation, and the unit may be implemented by hardware or software or a combination of hardware and software.

Figure 1:
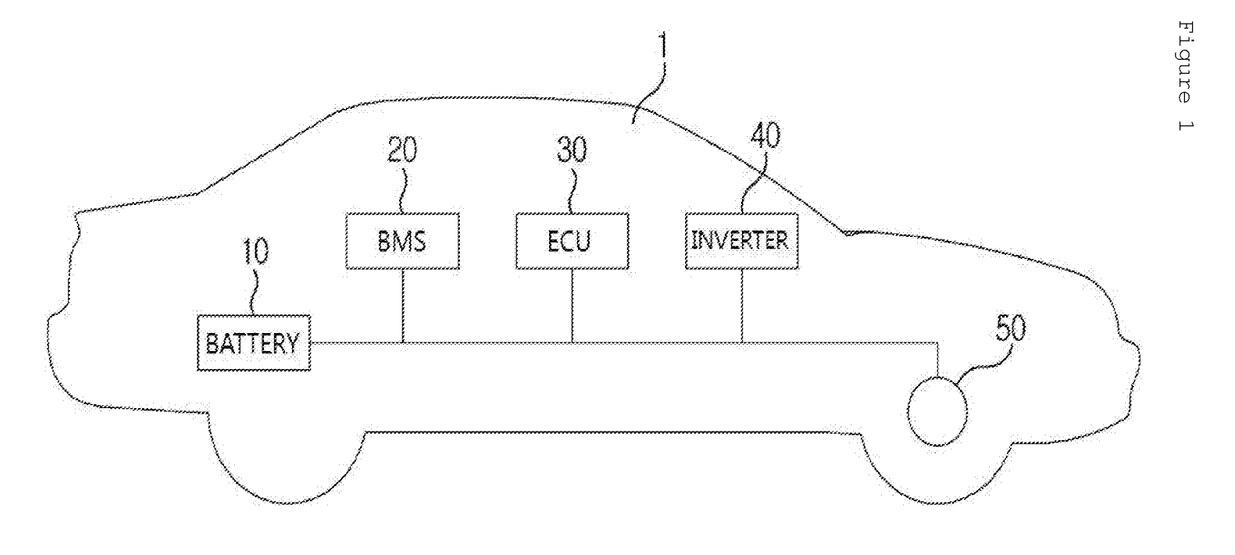
FIG. 1 is a diagram schematically illustrating an electric vehicle to which a device for diagnosing a switch using voltage distribution may be applied according to an embodiment of the present invention.

FIG. 1 is a diagram schematically illustrating an electric vehicle to which a device for diagnosing a switch using voltage distribution may be applied according to an embodiment of the present invention.

In FIG. 1, an example in which the device for diagnosing a switch using voltage distribution according to the embodiment of the present invention is applied to an electric vehicle 1 is illustrated, but the device for diagnosing a switch using voltage distribution according to the embodiment of the present invention may be applied to all technical fields to which a secondary battery such as a home or industrial energy storage system (ESS), or an uninterruptible power supply (UPS) system may be applied in addition to the electric vehicle.

The electric vehicle 1 may be configured to include a battery 10, a battery management system (BMS) 20, an electronic control unit (ECU) 30, an inverter 40, and a motor 50.

The battery 10 is an electric energy source that drives the electric vehicle 1 by providing driving force to the motor 50. The battery 10 may be charged or discharged by the inverter 40 by driving the motor 50 and/or an internal combustion engine (not illustrated).

Herein, a type of battery 10 is not particularly limited and the battery 10 may be constituted by, for example, a lithium ion battery, a lithium polymer battery, a nickel cadmium battery, a nickel hydrogen battery, a nickel zinc battery, and the like.

Further, the battery 10 is formed by a battery pack in which a plurality of battery cells is connected in series and/or in parallel. In addition, the battery 10 may include one or more battery packs.

The BMS 20 estimates the state of the battery 10 and manages the battery 10 by using estimated state information. For example, the BMS 20 estimates and manages state information of the battery 10, which includes a state of charging (SOC), a state of health (SOH), a maximum input/output power allowance amount, output voltage, and the like of the battery 10. In addition, the BMS 20 may control charging or discharging of the battery 10 by using the state information and furthermore, also estimate a replacement time of the battery 10.

The BMS 20 includes the device 100 for diagnosing a switch using voltage distribution according to the embodiment of the present invention to be described below or is connected to the device 100 for diagnosing a switch using voltage distribution to operate. The BMS 20 connects one or more resistors with a cathode switch in parallel in order to diagnose the cathode switch 110 positioned on a cathode power supply line connecting the battery 10 and a load and measures voltage applied to one resistor 130-1 to be measured among a plurality of resistors 130 to diagnose a state of the cathode switch 110.

The ECU 30 is an electronic control device that controls the state of the electric vehicle 1. For example, the ECU 30 determines a torque degree based on information such as an accelerator, a brake, a speed, and the like and controls an output of the motor 50 according to the torque information.

Further, the ECU 30 transmits a control signal to the inverter 40 so that the battery 10 is charged or discharged by the BMS 20.

The inverter 40 allows the battery 10 to be charged or discharged based on the control signal of the ECU 30.

The motor 50 drives the electric vehicle 1 based on control information (e.g., torque information) transferred from the ECU 30 by using electric energy of the battery 10.

Hereinafter, the device for diagnosing a switch using voltage distribution according to the embodiment of the present invention will be described with reference to FIGS. 2 and 3.

Figure 2:
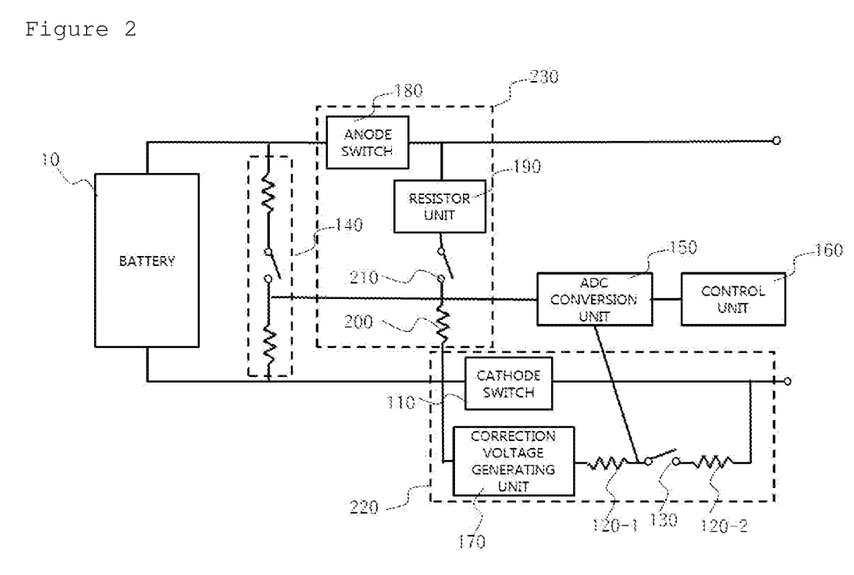
FIGS. 2 and 3 are diagrams schematically illustrating a device for diagnosing a switch using voltage distribution according to an embodiment of the present invention.
Figure 3:
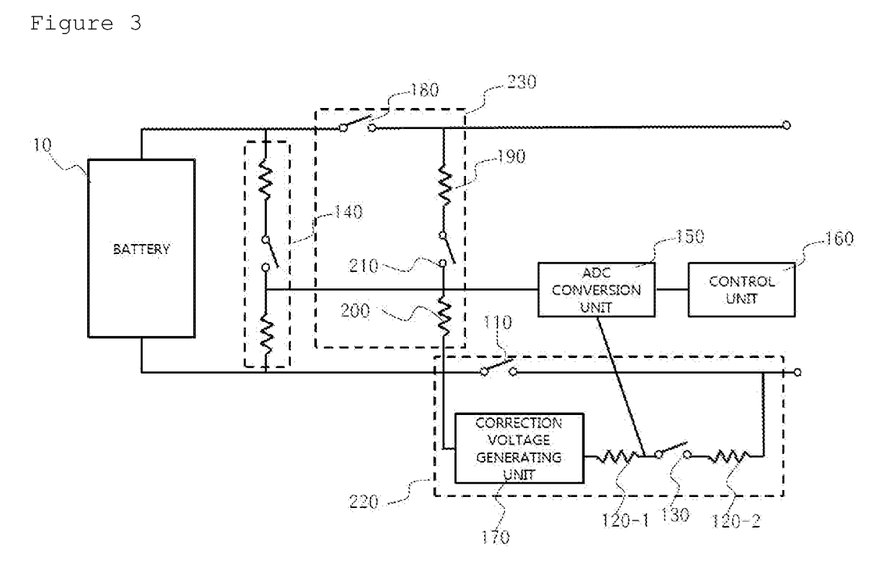

FIGS. 2 and 3 are diagrams schematically illustrating a device for diagnosing a switch using voltage distribution according to an embodiment of the present invention.

Referring to FIGS. 2 and 3, the device 100 for diagnosing a switch using voltage distribution according to the embodiment of the present invention may include a cathode switch 110, a plurality of resistors 120, a switch unit 130, a reference voltage generating unit 140, an ADC conversion unit 150, a control unit 160, and a correction voltage generating unit 170.

The device 100 for diagnosing a switch using voltage distribution illustrated in FIGS. 2 and 3 follows the embodiment and constituent elements thereof are not limited to the embodiment illustrated in FIGS. 2 and 3 and as necessary, the constituent elements may be added, modified, or deleted.

The cathode switch 110 may be positioned on the cathode power supply line connecting the battery 10 and the load and may connect or disconnect the battery 10 and the load. For example, the cathode switch 110 may be a switching element such as a relay, a contactor or a transistor, and a thyristor. The cathode switch 110 may include one or more switching elements depending on a use environment, a need of a user, and required safety.

The plurality of resistors 120-1 and 120-2 may be used to diagnose the cathode switch 110. The plurality of resistors 120-1 and 120-2 may be connected to each other in series and connected with the cathode switch 110 in parallel. Accordingly, the voltage applied to the cathode switch 110 may be calculated through the voltage of the battery 10 applied to the plurality of resistors 120-1 and 120-2. Based on the calculated voltage, the control unit 160 to be described below may diagnose the state of the cathode switch 110.

Magnitudes of one or more of the resistors 120-1 and 120-2 may be variously set depending on the voltage of the battery 10 and the type of the control unit 160. For example, the control unit 160 to be described below may be a micro controller unit (MCU). The MCU may support voltage values having magnitudes of 4 to 5V. However, since the battery 10 has relatively high voltage with a magnitude of 400 to 500V, it is difficult to be immediately applied with the power output from the battery 10 and use the applied power. Therefore, by reducing the voltage applied from the battery 10 using a voltage distribution law, the voltage may be adjusted to a voltage magnitude of a degree supported by the MCU. For example, the magnitudes of one or more of the resistors 120-1 and 120-2 may be 5 kΩ and 1 MΩ, respectively. When the voltage of the battery 10 is 400 V, as the voltage of the battery 10 applied to 5 kΩ, 1.99 V may be calculated by (400 V*5 kΩ)/1005 k. The voltage applied to a first resistor 120-1 is calculated to provide voltage at a level supported by the MCU.

The switch unit 130 may be positioned between the resistors 120-1 and 120-2 and may connect or disconnect the resistors 120-1 and 120-2. The switch unit 130 may include one or more switching elements such as the relay, the contactor or the transistor, and the thyristor similarly to the cathode switch 110. The switch unit 130 is operated only when the cathode switch 110 is intended to be diagnosed under on/off control by the control unit 160 to be described below, thereby preventing unnecessary power loss and leakage current from occurring.

The reference voltage generating unit 140 may generate reference voltage for diagnosing the state of the battery 10. Herein, the reference voltage may be a voltage value measured at the time when the battery 10 operates normally and may be a reference value for diagnosing the state of the battery 10 or diagnosing the state of the cathode switch 110 through the control unit 160 to be described below. For example, the reference voltage may be 400 V, and when the voltage measured by the battery 10 is 400 V or more, the state of the battery 10 may be diagnosed as an abnormal state through the control unit 160 to be described below. Further, when the reference voltage is applied through the control unit 160, the voltage to be applied to one resistor 120-1 to be measured among the resistors 120-1 and 120-2 may be calculated and the state of the cathode switch 110 may be diagnosed by comparing the calculated voltage and actually measured voltage.

The reference voltage generating unit 140 may include one or more resistors and one or more resistors are connected with the battery 10 in parallel to measure the voltage of the battery 10 and generate the reference voltage through the measured voltage. For example, the reference voltage generating unit 140 may include a resistor having a magnitude of 1 MΩ and a resistor having a magnitude of 10 kΩ. When the voltage of the battery 10 is 400 V, as the voltage of 400 V is applied to 1 MΩ and 10 kΩ and the voltage of 400 V becomes (400V*10kΩ/1010 kΩ according to the voltage distribution law, and as a result, the reference voltage of 3.96 V is generated.

Additionally, the reference voltage generating unit 140 may include one or more switches between a plurality of resistors. The switch is operated only when the reference voltage is intended to be generated through one or more switches to prevent unnecessary power loss and leakage current.

The ADC conversion unit 150 may convert the voltage of the battery 10 applied to one resistor 120-1 of a plurality of resistors 120-1 and 120-2 into a digital signal. Further, The ADC conversion unit 150 may convert the reference voltage generated from the reference voltage generating unit 120 into the digital signal. The ADC conversion unit 150 converts an analog value of the reference voltage and the measured voltage into the digital signal and outputs the digital signal to the control unit 160 to be described below so as to allow the control unit 160 to diagnose the state of the cathode switch 110.

The control unit 160 may calculate the voltage applied to one resistor 120-1 to be measured among a plurality of resistors 120-1 and 120-2 from the voltage of the battery 10 applied to the resistors 120-1 and 120-2 connected in series by using the voltage distribution and diagnose the state of the cathode switch 110 based on the calculated voltage.

The control unit 160 calculates the voltage to be applied to one resistor 120-1 based on the reference voltage and compares the voltage applied to one resistor 120-1 with the calculated voltage to diagnose the state of the cathode switch 110.

For example, referring to Table 1 and FIG. 3, when the voltage of the battery 10 is 500 V, the voltage of the battery 10 measured by varying from −500 V to 500 V may be set as the reference voltage to thereby calculate predicted voltage to be applied to the first resistor 120-1. When the control unit 160 intends to diagnose the state of the cathode switch 110, the control unit 160 may operate the switch included in the switch unit 130 and the reference voltage generating unit 140 to apply the voltage of the battery 10. When the voltage of the battery 10 is 500 V, the reference voltage generating unit 140 may set the reference voltage of the battery to 500 V, and as a result, the control unit 140 may calculate the predicted voltage to be applied to the first resistor 120-1 as 2.48 V. Herein, when the voltage applied to the first resistor 120-1 is measured by dividing the voltage of the battery 10 applied to the first resistor 120-1 and the second resistor 120-2, the control unit 160 may diagnose that the state of the cathode switch 110 is a normal state when 2.48 V is measured. In another embodiment, the control unit 160 may set a tolerance range within a predetermined range and when the voltage applied to the first resistor 120-1 is within the tolerance range of the reference voltage, the control unit 160 may diagnose that the state of the cathode switch 110 is the normal state. When the voltage of the battery 10 may be 300 V, the predicted voltage calculated based on the voltage of 300 V may be 1.48 V. However, when the voltage applied to the first resistor 120-1 calculated through the voltage distribution is 2.54 V, the voltage applied to the first resistor 120-1 is different from the reference voltage. In this case, the control unit 160 may diagnose that the state of the cathode switch 110 is abnormal. Further, in another embodiment, when the voltage applied to the first resistor 120-1 is not within the tolerance range of the reference voltage, the control unit 160 may diagnose that the state of the cathode switch 110 is abnormal.

TABLE 1

| Battery voltage | First resistor | Second resistor | Predicted voltage | Measured voltage |
| --- | --- | --- | --- | --- |
| −500 | 5 kΩ | 1 MΩ | −2.48 V | −2.48 V |
| −300 | 5 kΩ | 1 MΩ | −1.48 V | −1.48 V |
| −100 | 5 kΩ | 1 MΩ | −0.49 V | −0.49 V |
| 0 | 5 kΩ | 1 MΩ | 0 V | 0 V |
| 100 | 5 kΩ | 1 MΩ | 0.49 V | 0.49 V |
| 300 | 5 kΩ | 1 MΩ | 1.48 V | 2.54 V |
| 500 | 5 kΩ | 1 MΩ | 2.48 V | 2.48 V |

Herein, when the voltage of the battery 10 is −500V or more and 0 V or less, reverse voltage is applied to the first resistor 120-1. Therefore, the reverse voltage applied to the first resistor 120-1 may be provided to the MCU. The reverse voltage may cause malfunction and misdiagnosis of the MCU. Accordingly, in order to prevent the malfunction and the misdiagnosis, the device 100 for diagnosing a switch using voltage distribution according to the embodiment of the present invention may include a correction voltage generating unit 170.

The correction voltage generating unit 170 may apply correction voltage to one or more of the resistors 120-1 and 120-2. Herein, the correction voltage may be voltage that converts the reverse voltage applied to one resistor 120-1 to be a measured of one or more of the resistors 120-1 and 120-2 into constant voltage. For example, referring to Table 1, when the voltage of the battery 10 is −500 V, the voltage applied to the first resistor 120-1 from the battery 10 may be −2.48 V. Therefore, the constant voltage of 0.02 V may be applied by applying the correction voltage of 2.5V to the first resistor 120-1. Further, when the voltage of the battery 10 is 500 V, the voltage applied to the first resistor 120-1 may be 2.48 V and when the correction voltage is applied, the voltage may be 4.98 V. The voltage may be the magnitude of voltage which may be supported even when the control unit 160 is the MCU. As described above, the correction voltage may convert the reverse voltage of the first resistor 120-1 to be measured into the constant voltage and may be set to a value that may have a magnitude which may be supported by the control unit 160. In this case, the control unit 160 compares a value obtained by adding the correction voltage to the reference voltage and a value obtained by adding up the voltage measured in the first resistor 120-1 and the correction voltage with each other to diagnose whether the cathode switch 110 is abnormal.

The control unit 160 may diagnose the state of the cathode switch 110 by comparing the voltage values digitally signalized through the ADC conversion unit 150 as described above.

The device 100 for diagnosing a switch using voltage distribution according to the embodiment of the present invention may further include an anode switch 180, a resistor unit 190, a diagnostic resistor 200, and a switch 210.

The anode switch 180 may be positioned on an anode power supply line connecting the battery 10 and the load and may connect or disconnect the battery 10 and the load. The anode switch 180 may be the switching element such as the relay, the contactor or the transistor, and the thyristor similarly to the cathode switch 110. The anode switch 180 may include one or more switching elements due to the use environment, the need of the user, and the required safety.

One side of the resistor unit 190 may be connected to the anode switch 180 and the other side thereof may be connected to the diagnostic resistor 200 to be described below.

The diagnostic resistor 200 may be connected to the resistor 190 in order to diagnose the state of the anode switch 180. Herein, the resistor unit 190 and the diagnostic resistor 200 are resistors used for the voltage distribution and the magnitude of the resistor 190 may be larger than the magnitude of the diagnostic resistor 140. For example, the magnitude of the resistor unit 190 may be 1 MΩ and the magnitude of the diagnostic resistor may be 10 kΩ.

The switch 210 may be positioned between the resistor unit 190 and the diagnostic resistor 200 and may connect or disconnect the resistor unit 130 and the diagnostic resistor 140. The switch 210 performs an on/off operation under the control of the control unit 160 to connect or disconnect the resistor unit 190 and the diagnostic resistor 200. Only when the state of the anode switch 180 is intended to be diagnosed through the connection or disconnection, the resistor unit 190 and the diagnostic resistor 200 are connected by controlling the operation of the switch 210 to prevent the unnecessary power loss and leakage current from occurring.

The control unit 160 may calculate the voltage applied to the diagnostic resistor 200 from the voltage of the battery 10 applied to the resistor unit 190 and the diagnostic resistor 200 by using the voltage distribution and diagnose the state of the anode switch 180 based on the calculated voltage.

Additionally, the cathode switch 110 and the resistors 120-1 and 120-2 may be constituted by one cathode switch diagnosing unit 220. Further, the anode switch 180, the resistor unit 190, and the diagnostic resistor 200 may be constituted by one anode switch diagnosing unit 230. In addition, the ADC conversion unit 150 and the control unit 160 may be positioned outside the cathode switch diagnosing unit 220 and the anode switch diagnosing unit 230. When each of a plurality of switches is intended to be monitored and diagnosed through the ADC conversion unit 150 and the control unit 160, the cathode switch diagnosing unit 220 or the anode switch diagnosing unit 230 is configured for each of the plurality of switches and the plurality of switches may be diagnosed through one ADC conversion unit 150 and one control unit 160 positioned outside.

In another embodiment, the cathode switch 110 and the anode switch 180 may be used while being replaced with other components to be diagnosed. For example, in order to diagnose the state of a fuse, one or more of the resistors 120-1 and 120-2 are connected to the fuse in the method described above and the voltage of the battery applied to one resistor 120-1 to be measured of the resistors 120-1 and 120-2 is measured to diagnose the state of the fuse.

The states of a plurality of components positioned inside the battery pack 10 or the BMS, such as the cathode switch 110, the anode switch 180, and the fuse are measured by one external ADC conversion unit 150 and one control unit 160 and an additional component for diagnosis is not used or a separate system is not constructed to thereby reduce the volumes and the prices of the battery pack 10 and the BMS.

Hereinafter, a method for diagnosing a cathode switch and an anode switch by using a method (S100) for diagnosing a switch using voltage distribution according to an embodiment of the present invention will be described with reference to FIGS. 4 and 5.

Figure 4:
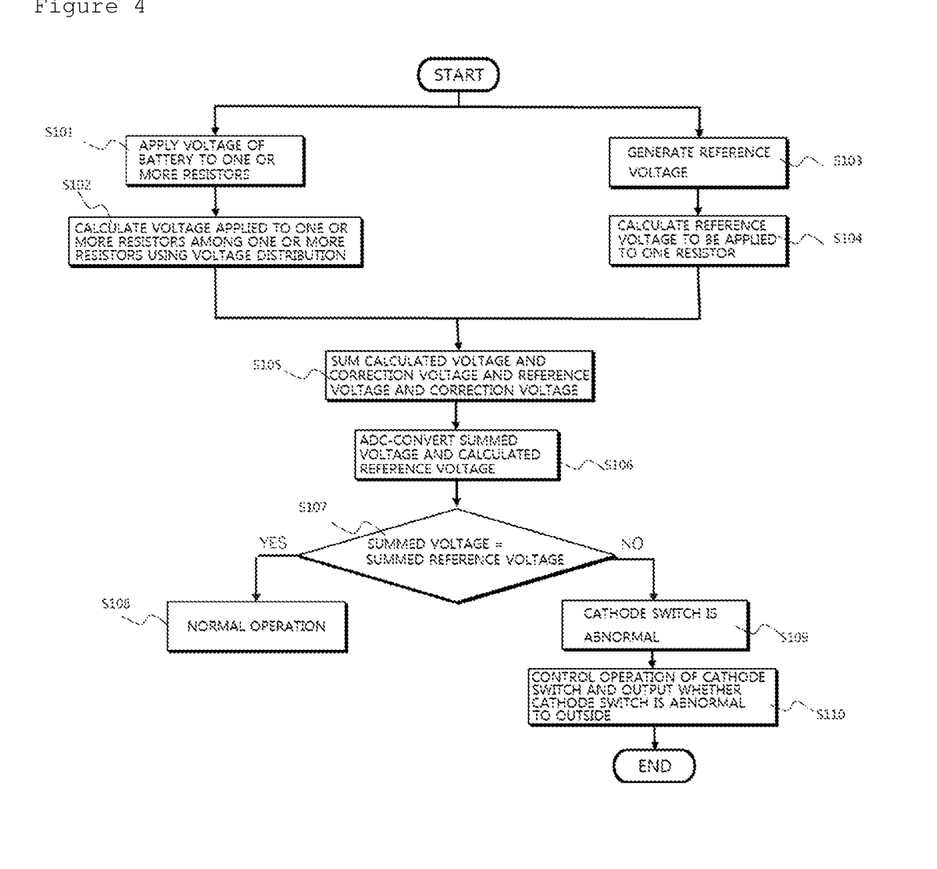
FIG. 4 is a flowchart for describing a method for diagnosing a cathode switch by using a method for diagnosing a switch using voltage distribution according to an embodiment of the present invention.

FIG. 4 is a flowchart for describing a method for diagnosing a cathode switch by using a method for diagnosing a switch using voltage distribution according to an embodiment of the present invention.

Referring to FIG. 4, when disclosed is the method for diagnosing a cathode switch by using the method for diagnosing a switch using voltage distribution according to the embodiment of the present invention, the voltage of the battery is applied to a plurality of resistors (S101). Then, the voltage of the battery applied to one resistor to be measured of the plurality of resistors is calculated by using the voltage distribution (S102). The reference voltage generating unit generates the reference voltage (S103) and calculates the voltage of the battery to be applied to one resistor to be measured based on the generated reference voltage (S104). The voltage calculated in step S102 and the reference voltage calculated in step S104 are summed with the correction voltage generated by the correction voltage generating unit (S105). The summed voltage is ADC-converted through the ADC conversion unit (S106) and the converted value is provided to the control unit to diagnose the cathode switch (S107). When the voltage applied to one of the resistor, which is summed with the resultant correction voltage diagnosed in step S107 is equal to the reference voltage summed with the correction voltage, the cathode switch is diagnosed to be normal and a normal operation is performed (S108). However, when the voltage applied to one resistor, which is summed with the correction voltage is not equal to the reference voltage summed with the correction voltage, the cathode switch is diagnosed to be abnormal (S109) and the operation of the cathode switch is controlled or whether the cathode switch is abnormal is output to the outside (S110).

Figure 5:
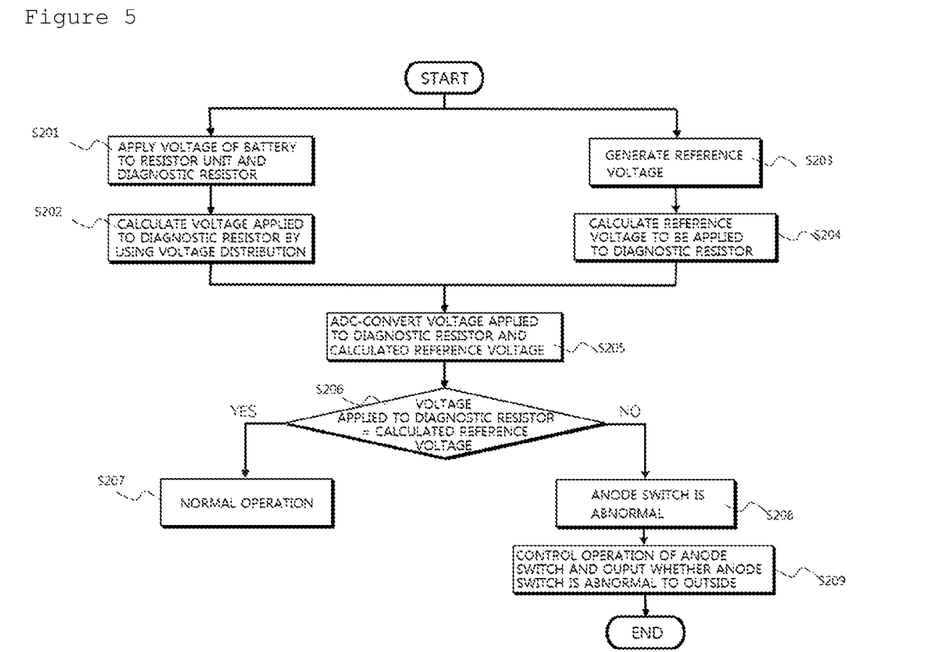
FIG. 5 is a flowchart for describing a method for diagnosing an anode switch by using the method for diagnosing a switch using voltage distribution according to an embodiment of the present invention.

FIG. 5 is a flowchart for describing a method for diagnosing an anode switch by using the method for diagnosing a switch using voltage distribution according to an embodiment of the present invention.

Referring to FIG. 5, when there is disclosed the method for diagnosing the anode switch by using the method for diagnosing the switch using voltage distribution according to the embodiment of the present invention, the voltage of a battery is applied to a plurality of resistors (S201). Thereafter, the voltage of the battery applied to the diagnostic resistor of the voltages of the battery applied to the resistor unit and the diagnostic resistor by using the voltage distribution is calculated (S202). Further, the reference voltage generating unit generates the reference voltage (S203) and calculates the voltage of the battery to be applied to the diagnostic resistor based on the generated reference voltage (S204). The voltage applied to the diagnostic resistor calculated in step S202 and the reference voltage to be applied to the diagnostic resistor calculated in step S204 are ADC-converted (S205). A voltage value converted in step S205 is provided to the control unit and the control unit compares the voltage applied to the diagnostic resistor and the reference voltage to be applied to the diagnostic resistor (S206). When the voltage applied to the diagnostic resistor and the reference voltage to be applied to the diagnostic resistor are equal to each other through step S206, the anode switch is diagnosed to be in a normal state and a normal operation is performed (S207). On the contrary, when the voltage applied to the diagnostic resistor and the reference voltage to be applied to the diagnostic resistor are not equal to each other through step S206, the anode switch is diagnosed to be abnormal (S208) and an operation of the anode switch is controlled (S209). Further, whether the anode switch is abnormal is output to the outside.

The aforementioned method for diagnosing the switch using the voltage distribution has been described with reference to the flowcharts presented in the drawings. The method has been shown and described by a series of blocks for purposes of simplicity, but it is to be understood that the present invention is not limited to the order of the blocks, and that some blocks may be referred to in different orders and concurrently with other blocks as shown and described in the present specification, and various other branches, flow paths, and orders of blocks may be implemented to achieve the same or similar result. In addition, all illustrated blocks may not be required for the implementation of the method described in the present specification.

Hereinabove, a specific embodiment of the present invention has been illustrated and described, but the technical spirit of the present invention is not limited to the accompanying drawings and the described contents and it is apparent to those skilled in the art that various modifications of the present invention can be made within the scope without departing from the spirit of the present invention and it will be regarded that the modifications are included in the claims of the present invention without departing from the spirit of the present invention.

The invention claimed is:

1. A device for diagnosing a cathode switch positioned on a cathode power supply line adapted to switch between connecting and disconnecting a battery and a load, the device comprising:
   a reference voltage circuit connecting a first point on the cathode power supply line between the battery and the cathode switch to an anode power supply line between the battery and the load, the reference voltage circuit including at least one first resistor and a first switch;
   a cathode switch diagnosis circuit connecting a second point on the cathode power supply line between the cathode switch and the load to the anode power supply line between the battery and the load, the cathode switch diagnosis circuit including at least one second resistor and a second switch; and
   a controller configured to:
      measure a reference voltage at a cathode power supply line side of the first resistor;
      measure a diagnosis voltage at the cathode power supply line side of the second resistor; and
      diagnose a state of the cathode switch based on a comparison of the measured reference voltage to the measured diagnosis voltage.

2. The device of claim 1, further comprising:
   an ADC conversion unit converting the reference voltage into a first digital signal, and the diagnosis voltage into a second digital signal
   wherein the controller is configured to diagnose the state of the cathode switch based on a comparison of the first digital signal to the second digital signal.

3. The device of claim 1,
   wherein the cathode switch diagnosis circuit includes a plurality of second resistors,
   wherein the second switch is positioned between the plurality of second resistors, and
   wherein the controller is configured to:
      control the second switch to a closed state; and
      measure the diagnosis voltage while the second switch is in the closed state.

4. The device of claim 1,
   wherein the cathode switch diagnosis circuit includes a correction voltage generator configured to apply a correction voltage to the second resistor,
   wherein the controller is configured to:
      sum the diagnosis voltage and the correction voltage; and
      diagnose the state of the cathode switch based on the summed voltage.

5. The device of claim 1, further comprising:
   an anode switch positioned on the anode power supply line and adapted to switch between connecting and disconnecting the battery and the load;
   a diagnostic resistor for diagnosing the anode switch; and
   an anode switch diagnosis circuit of which a first side is connected with the anode switch and a second side is connected with the diagnostic resistor.

6. The device of claim 5, wherein the controller is configured to:
   calculate a voltage applied to the diagnostic resistor from a voltage of the battery applied to the anode switch diagnosis circuit and the diagnostic resistor based on voltage distribution; and
   diagnose a state of the anode switch based on the calculated voltage.

7. The device of claim 1, wherein the cathode switch and the switch constitute a cathode switch diagnosing unit and the controller is positioned outside of the cathode switch diagnosing unit.

8. A method for diagnosing a cathode switch positioned on a cathode power supply line adapted to switch between connecting and disconnecting a battery and a load, the method comprising:
   measuring, by a controller, a refernece voltage at a reference voltage circuit connecting a first point on the cathode power supply line between the battery and the cathode switch to an anode power supply line between the battery and the load, wherein the reference voltage circuit includes at least one first resistor and a first switch and wherein the reference voltage is measured at a cathode power supply line side of the first resistor;
   measuring, by the controller, a diagnosis voltage at a cathode switch diagnosis circuit connecting a second point on the cathode power supply line between the cathode switch and the load to the anode power supply line between the battery and the load, wherein the cathode switch diagnosis circuit includes at least one second resistor and a second switch, and wherein the diagnosis voltage is measured at the cathode power supply line side of the second resistor; and diagnosing, by the controller, a state of the cathode switch based on a comparison of the measured reference voltage to the measured diagnosis voltage.

9. The method of claim 8, further comprising:
converting, by an ADC conversion unit, the refernece voltage into a first digital signal, and the diagnosis voltage into a second digital signal,
wherein diagnosing the state of the cathode switch is based on a comparison of the first digital signal to the second digital signal.

10. The method of claim 8, wherein the cathode switch diagnosis circuit includes a plurality of second resistors, wherein the second switch is positioned between the plurality of second resistors, the method further comprising:
controlling the second switch to a closed state; and
measuring the diagnosis voltage while the second switch is in the closed state.

11. The method of claim 8,
wherein the cathode switch diagnosis circuit includes a correction voltage generator configured to apply a correction voltage to the second resistor,
wherein the method further comprises summing the diagnosis voltage and the correction voltage, and
wherein diagnosing the state of the cathode switch is based on the summed voltage.

12. The method of claim 8,
wherein an anode switch is positioned on the anode power supply line and is adapted to switch between connecting and disconnecting the battery and the load, wherein an anode switch diagnosis circuit is connected at a first side with the anode switch and with a diagnostic resistor at a second, the method further comprising diagnosing, by the diagnostic resistor, the anode switch.

13. The method of claim 12, the method further comprises calculating, by the controller, a voltage applied to the diagnostic resistor from a voltage of the battery applied to the anode switch diagnosis circuit and the diagnostic resistor based on voltage distribution, and wherein diagnosing the anode switch comprises diagnosing a state of the anode switch based on the calculated voltage.

14. A method for installing a cathode switch diagnosis circuit for diagnosing a cathode switch positioned on a cathode power supply line adapted to switch between connecting and disconnecting a battery and a load, the method comprising:
connecting a reference voltage circuit between (i) a first point on the cathode power supply line between the battery and the cathode switch and (ii) an anode power supply line between the battery and the load, wherein the reference voltage circuit includes at least one first resistor and a first switch;
connecting the cathode switch diagnosis circuit between (i) a second point on the cathode power supply line between the cathode switch and the load and (ii) the anode power supply line between the battery and the load, wherein the cathode switch diagnosis circuit includes at least one second resistor and a second switch; and
positioning a controller to receive a measurement of a reference voltage at a cathode power supply line side of the first resistor and diagnosis voltage at the cathode power supply line side of the second resistor.

15. The method of claim 14,
wherein the cathode switch diagnosis circuit includes the cathode switch; and
wherein the controller is positioned outside the cathode switch diagnosis circuit.

* * * * *